United States Patent [19]

Sato

[11] Patent Number: 4,523,157
[45] Date of Patent: Jun. 11, 1985

[54] PLL OUT-OF-CAPTURE RANGE DETECTION AND LOCK ACQUISITION CIRCUIT

[75] Inventor: Yu Sato, Tokyo, Japan
[73] Assignee: Nippon Kogaku K. K., Japan
[21] Appl. No.: 422,952
[22] Filed: Sep. 24, 1982

[30] Foreign Application Priority Data

Oct. 27, 1981 [JP] Japan ................... 56-170738

[51] Int. Cl.³ .............................. H03L 7/08
[52] U.S. Cl. ................................... 331/4; 331/11; 331/14; 331/17; 331/DIG. 2; 455/260
[58] Field of Search ............. 331/4, 17, DIG. 2, 10, 331/11, 14, 25; 455/260

[56] References Cited

U.S. PATENT DOCUMENTS 4,007,429  2/1977  Cadalora et al. ......... 331/DIG. 2 X
4,316,154  2/1982  Krause .................... 331/DIG. 2 X
4,388,598  6/1983  Egan ...................... 331/DIG. 2 X
4,433,308  2/1984  Hirata .................... 331/DIG. 2 X

FOREIGN PATENT DOCUMENTS 66702   5/1979  Japan ..................... 455/260
154248 12/1979  Japan ..................... 331/17

Primary Examiner—Eugene R. Laroche
Assistant Examiner—D. C. Mis
Attorney, Agent, or Firm—Shapiro and Shapiro

[57] ABSTRACT

An improved PLL frequency synthesizer for producing a signal of frequency $f_T - f_{IF}$ or $f_T + f_{IF}$ is provided with a detection-control circuit which detects from the voltage applied to a voltage controlled oscillator (VCO) in the PLL that the VCO frequency reaches an upper or lower limit frequency and upon the detection forces the VCO to fall into the capture range. The improved PLL frequency synthesizer can acquire lock even if it has been thrown out of the capture range.

2 Claims, 12 Drawing Figures

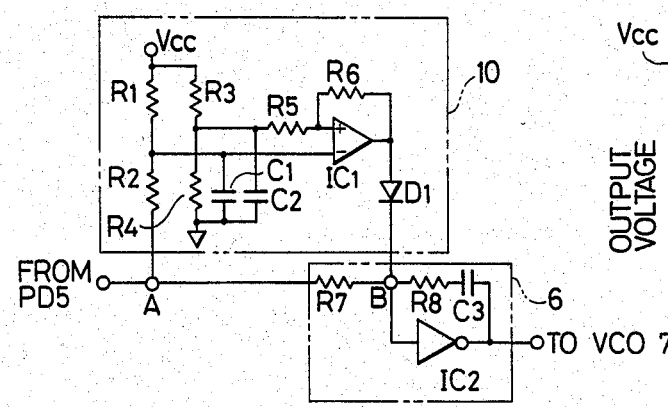
FIG. 4
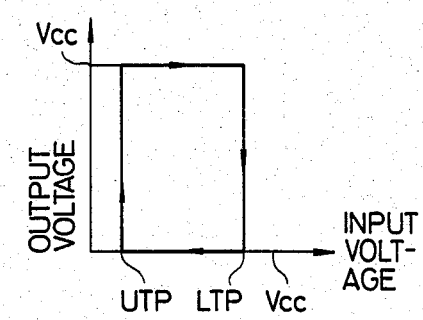
FIG. 5
FIG. 6A
FIG. 6B
FIG. 6C
FIG. 6D
FIG. 6E
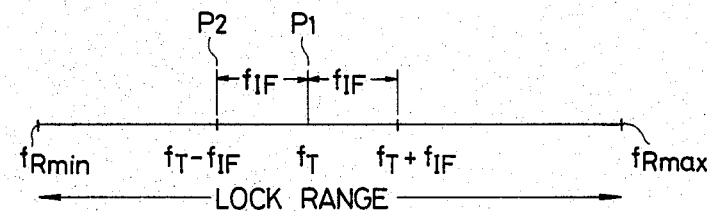
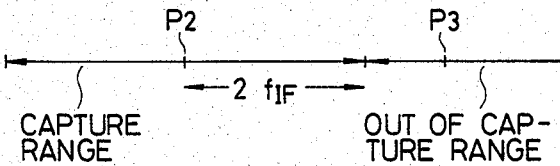

PLL OUT-OF-CAPTURE RANGE DETECTION AND LOCK ACQUISITION CIRCUIT

BACKGROUND OF THE INVENTION

1. Field of the Invention

This invention relation to an improvement in frequency synthesizers in a phase locked loop circuit configuration for producing an output signal which differs from an input signal by a certain frequency difference, particularly adapted for use as a frequency signal generator in radio tranceivers, optical range measuring equipments and so on.

2. Description of the Prior Art

Conventionally, frequency synthesizers, such as a circuit made up of two quadrature phase shifters, two balanced modulators and one adder, have been used for local oscillators in various kinds of equipments. This kind of frequency synthesizer, however, has several disadvantages; that is, difficulty in precisely tuning the above mentioned circuit units, a large number of circuit elements, and difficulty in reducing, through a simple circuit, spurious components which are introduced into a local oscillator output signal due to a change in amplitude of the quadrature phase shifter's output as the input signal frequency varies (for instance, by channel switching in a tranceiver). To overcome the above disadvantages, recently a frequency synthesizer in phase locked loop (PLL) circuit configuration has been proposed as a frequency signal generator for producing a signal of frequency $f_R$ equal to a frequency $f_T - f_{IF}$ or $f_T + f_{IF}$, where $f_T$ is the frequency of an input signal and $f_{IF}$ is an intermediate frequency which is predetermined as a frequency difference. Such PLL frequency synthesizer still has a specific disadvantage. In this synthesizer, there is a problem in that when frequency $f_T$ of the input signal changes by more than $2f_{IF}$, the PLL is thrown out of the capture range and then can no longer acquire lock.

SUMMARY OF THE INVENTION

An object of the present invention is to provide an improvement in reliability of PLL frequency synthesizers producing a signal of frequency $f_T - f_{IF}$ or $f_T + f_{IF}$ even if the frequency $f_T$ of the input signal varies over a wide range larger than $2f_{IF}$.

According to the present invention, an improved PLL frequency synthesizer is provided with a detection-control circuit for detecting from the voltage to be applied to a voltage controlled oscillator (VCO) in the PLL that the VCO frequency reaches an upper or lower limit frequency and upon the detection forcing the VCO frequency into the capture range.

The invention will become more fully apparent from the following detailed description thereof taken in conjunction with the drawings.

BRIEF DESCRIPTION OF THE DRAWINGS

FIG. 4 is a circuit diagram showing a first specific embodiment of the detection-control circuit and the lowpass filter in the PLL frequency synthesizer of FIG. 3.

FIG. 5 shows a hysteresis curve of the comparator in the detection-control circuit of FIG. 4.

FIGS. 6A-6E illustrate the operation of the invention under different conditions of input frequency, intermediate frequency and output frequency.

DETAILED DESCRIPTION

Prior Art Frequency Synthesizer

Figure 1:
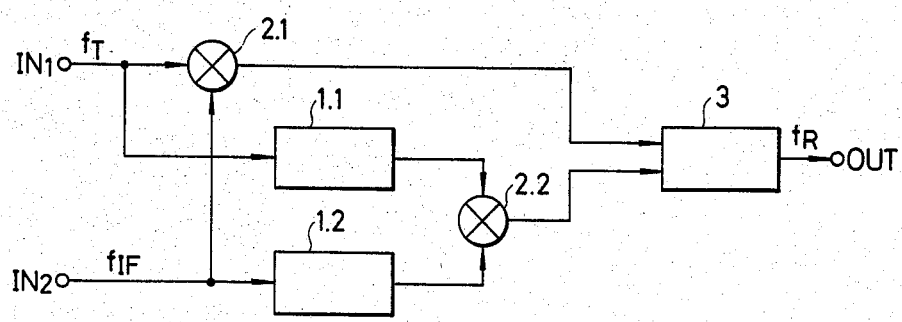
FIG. 1 is a schematic block diagram showing a conventional prior art frequency synthesizer.

A conventional prior art frequency synthesizer, not in PLL circuit configuration, is shown in FIG. 1. This type of synthesizer is formed of two quadrature phase shifters 1.1 and 1.2, balanced modulators 2.1 and 2.2 and adder 3. Input signals of frequencies $f_T$ and $f_{IF}$ are applied to input terminals IN1 and IN2, respectively. The input signals are processed through the circuit in a known manner and an output signal having frequency $f_R = f_T - f_{IF}$ is produced at output terminal OUT. This circuit has the disadvantages previously stated.

Figure 2:
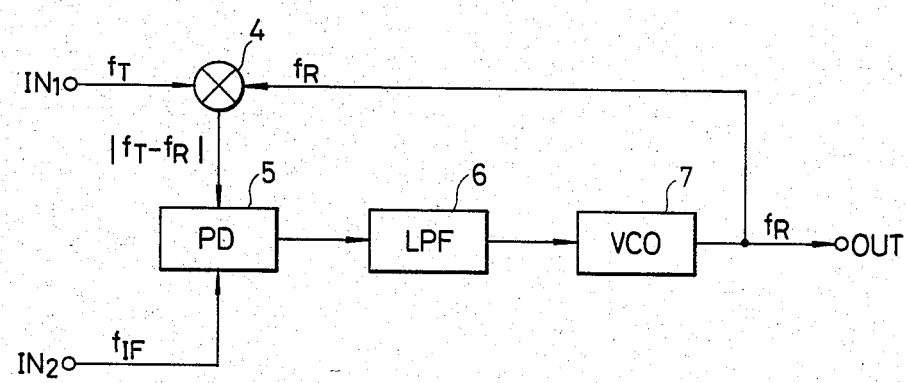
FIG. 2 is a schematic block diagram showing a prior art PLL frequency synthesizer.
Figure 3:
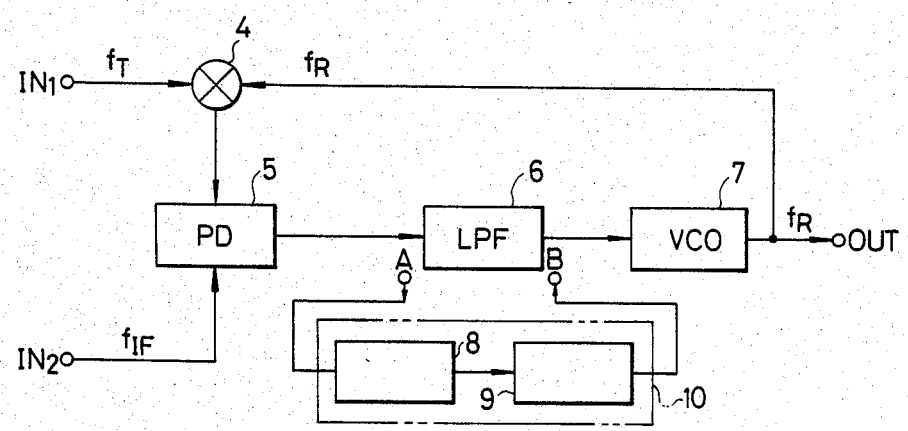
FIG. 3 is a schematic block diagram showing the fundamental configuration of an improved PLL frequency synthesizer in accordance with the present invention.

A typical PLL frequency synthesizer, which is considered to be the background of the present invention, for producing an output signal having frequency $f_R = f_T - f_{IF}$ is shown in FIG. 2. A transmitting signal with variable frequency $f_T$ and a reference signal of a predetermined intermediate frequency $f_{IF}$ are applied to terminal IN1 and IN2, respectively. Assuming that VCO 7 now oscillates at frequency $f_R$, mixer 4 mixes the two signals of frequencies $f_T$ and $f_R$ and produces an output signal of difference frequency $|f_T - f_R|$. At phase detector (or phase comparator) 5, two frequencies $|f_T - f_R|$ and $f_{IF}$ are compared with each other and a voltage dependent on the difference thereof is generated as an output signal voltage. The output voltage of phase detector 5 is applied through lowpass filter 6 to VCO 7. The PLL of FIG. 3 is so designed that VCO 7 may lock with $f_R = f_T - f_{IF}$. The output voltage of phase detector 5 becomes a high level and drives VCO 7 to increase its oscillating frequency $f_R$ when frequencies $|f_T - f_R|$ and $f_{IF}$ of the two signals applied to phase detector 5 are in the relation of $|f_T - f_R| > f_{IF}$. Inversely, the output voltage of phase detector 5 becomes a low level and drives VCO 7 to reduce its oscillating frequency $f_R$ when $|f_T - f_R| < f_{IF}$. When frequency $f_T$ transiently changes in a step manner, the PLL can not immediately respond to such a step-like frequency change because it takes a pull-in time to establish lock with the current state after the change. Accordingly, VCO 7 will remain at a last locked frequency for a moment immediately after the step-like abrupt change in frequency $f_T$. The sweep direction of VCO 7 depends upon where frequency $f_T$ of the transmitting signal after the step-like change is positioned with respect to frequency $f_R$ of VCO 7, which is locked at the state before such a change of frequency $f_T$. FIG. 6A shows the relative positioning of frequency $f_R$ of VCO 7 locked at the state before a change in frequency $f_T$ with respect to frequency $f_T$ after such a change. Point $P_1$ indicates the position of $f_T$ which is the current frequency of the transmitting signal after the change and point $P_2$ the position of $f_R$ which is a frequency with which VCO 7 is expected to be locked after the change in frequency $f_T$. The lock range (or tracking range) of VCO 7 over which the PLL remains in lock once lock has been achieved is shown as a frequency band from $f_{RMIN}$ to $f_{RMAX}$. FIG. 6B shows the regions defined by relations in magnitude of frequencies $|f_T - f_R|$ and $f_{IF}$ of the two signals applied to the phase detector. FIG. 6C shows the sweep direction in which VCO 7 moves in response to the change of frequency $f_T$. FIG. 6D shows the regions of feedback mode of the PLL. FIG. 6E shows the capture range of the PLL over which the loop can acquire lock with changed state when the PLL is thrown out of lock due to such a change. From the drawings of FIGS. 6A–6E, it will be easily understood that, when frequency $f_T$ of the transmitting signal at the current state after a change and frequency $f_R$ VCO 7 locked at the last state before such a change in frequency $f_T$ are in the relation of $f_R < f_T + f_{IF}$, VCO 7 is driven to sweep toward expected lock frequency $f_T - f_{IF}$ and the PLL will fall into lock after a pull-in time. In this case, the frequency range from $f_{RMIN}$ to $f_T + f_{IF}$ is referred to as the "capture range". While, in the case of $f_R > f_T + f_{IF}$, that is, frequency $f_R$ of VCO 7 locked at the last state before the change in frequency $f_T$ is outside the capture range determined by $f_T$, VCO 7 is driven to move away from the expected lock frequency $f_T - f_{IF}$ and reach the upper end frequency $f_{RMAX}$. Thus, the PLL can not establish lock. Now it is assumed that $f_R$ of VCO 7 is locked with a frequency at point P3 in FIG. 6E which is located outside the capture range and VCO 7 is required to lock with the frequency at point P2 which deviates from P3 by a frequency difference larger than $2f_{IF}$. Such a requirement in the PLL will not be achieved because VCO 7 has been driven to the upper end frequency $f_{RMAX}$ of the lock range. When the PLL is thrown out of lock by changing frequency $f_T$ of the transmitting signal in a step-like manner, frequency $f_{T(n+1)}$ after such a step-like change and frequency $f_{Rn}$ before such a change must have a relation of $f_{T(n+1)} > f_{Rn} - f_{IF}$ for establishing lock with the current status. Accordingly, where it is required to vary frequency $f_T$ of the transmitting signal applied to the PLL over a wide frequency range larger than $2f_{IF}$, $f_T$ must be changed in such a manner that the above relation for capturing conditions may always be maintained during the changing. In tranceivers, for example, there is a problem in that the above relation for capturing conditions is not maintained because random channel switching is required, and thus a large step-like frequency change of the transmitting signal may take place. Such a frequency change due to channel switching must be conducted bit by bit through a predetermined sequence, maintaining the above relation for capturing conditions. Because of this disadvantage, the conventional PLL synthesizer of FIG. 2 has not been available for equipment like tranceivers.

PREFERRED EMBODIMENTS IN ACCORDANCE WITH THE INVENTION

FIG. 3 illustrates an essential configuration of the invention in a block diagram representation. As an addition to the circuit of FIG. 2, the circuit of FIG. 3 includes detection-control circuit 10 enclosed with a dot line, which consists of detector 8 and control circuit 9. Although the circuits of FIGS. 2 and 3 are provided with lowpass filter 6, filter 6 is not necessarily required for the PLL because it is generally used only for improving the characteristics of the PLL. At terminal A which is connected to the loop, detector 8 detects that the PLL has been thrown out of the capture range. Upon the detection, through terminal B which is connected to the loop, control circuit 9 forces VCO 7 to oscillate below $f_R = f_T + f_{IF}$ at which lock can be acquired. When VCO 7 has shifted into the capture range, control circuit 9 causes the PLL to operate in the ordinary PLL operation mode. By providing the PLL with detection-control circuit 10, the PLL can be automatically driven into the capture range state and acquire lock even if it is thrown far out of the capture range due to a step-like change.

The detection-control circuit 10 is constructed as shown in FIG. 4, for example. This circuit is adaptable for use with a completely integrated type of low pass filter 6, for instance, consisting of resistors $R_7$, $R_8$, capacitor $C_3$ and inverting amplifier $IC_2$. As phase detector 5, a phase comparator unit included in the integrated circuit device CD4046 marketed by RCA corporation is available. TC 5081 AP marketed by Tokyo Shibaura Electric Co., Ltd. which has the same function as the phase comparator contained CD4046 is also available for the phase detector 5. Different from an Exclusive OR type of phase comparator, these IC devices produce an output signal with the power source voltage or 0 volts according to the polarity of the frequency difference between two input signals.

Detection-control circuit 10 may comprise a single integrated circuit device $IC_1$ which is a hysteresis comparator with the input-output characteristics shown in FIG. 5. In FIG. 5, the input voltage on the X axis is taken at input termnal A of FIG. 3, the output voltage on the Y axis at output terminal B of FIG. 3, $V_{CC}$ represents the voltage of the power supply source, UTP the voltage of the upper trip point in the hysteresis curve and LTP the voltage of the lower trip point in the hysteresis curve. Since the output impedance of phase detector 5 is very high in lock condition, resistors $R_1$ and $R_2$ should be selected to have resistance values as high as possible to ensure that the voltage at inverting input terminal (−) of comparator $IC_1$ is higher than the UTP, the lowpass filter consisting of resistors $R_1$, $R_2$ and capacitor $C_1$ has a cutoff frequency sufficiently lower than the phase comparing frequency of the PLL, and the output characteristics of phase detector 5 are maintained without deterioration. Device $IC_1$, which is a voltage comparator of an integrated circuit type or a general purpose operational amplifier, forms a hysteresis comparator in cooperation with resistors $R_3$, $R_4$, $R_5$, and $R_6$ and realizes the hysteresis curve as shown in FIG. 5 by applying a positive-feedback through resistors $R_5$ and $R_6$ to the threshold level determined by resistors $R_3$ and $R_4$. The resistances of resistors $R_1$ and $R_2$ are selected so that the voltage at the conjunction point between resistors $R_1$ and $R_2$ may be lower than UTP of the hysteresis curve of FIG. 5 when the output voltage of phase detector 5 is a low level, that is about 0 volts. And also it is preferable in the circuit performance that resistor $R_2$ has much higher resistance than that of resistor $R_7$. Capacitor $C_2$ is connected across resistor $R_4$ to stabilize the threshold voltage level. Capacitor $C_1$ is connected between the ground potential and the junction point of resistors $R_1$ and $R_2$ to eliminate high frequency components which may be contained in the output of phase detector 5. With TC5081AP as the phase detector, the inverting amplifier contained in TC5081AP is advantageously available for inverting amplifier $IC_2$ of lowpass filter 6. When the PLL is arranged to lock with $f_R = f_T - f_{IF}$, the output frequency of VCO 7 reaches the highest frequency of the lock range after the PLL has been thrown out of the capture range. At this time, the input voltage applied to VCO 7 rises up to approximately power source voltage. (There is a type of VCO in which the voltage applied to the VCO drops to 0 volts at this time. This case, however, will not be explained because such a circuit can be constructed only with a minor modification of the circuit of FIG. 4.). The input voltage of lowpass filter 6 is at about 0 volts due to the inverting amplifier $IC_2$. Accordingly, the voltage at the inverting input terminal of the hysteresis comparator becomes under UTP and then the output voltage of the hysteresis comparator becomes a high level (approximately power source voltage). Diode $D_1$, which is made conductive due to the high level voltage at the output of the hysteresis comparator, raises the input voltage of inverting amplifier $IC_2$ over the threshold voltage of inverting amplifier $IC_2$. Consequently, the output voltage of $IC_2$ temporarily drops to the minimum voltage (approximately 0 volts). This voltage drop at the output of the lowpass filter causes the dropping of output frequency $f_R$ of VCO 7. As output frequency $f_R$ falls into the capture range, hat is $f_T - f_{IF} < f_R < f_T + f_{IF}$, the output voltage of phase detector 5 becomes a high level (approximately power source voltage). As a result, the voltage at the inverting input terminal of the hysteresis comparator goes over LTP and then the output thereof is inverted to be approximately 0 volts. This reversely biases diode $D_1$ which electrically separates or insulates detection-control circuit 10 from lowpass filter 6. After the above steps, the PLL operation in the circuit recovers to the condition of $f_R < f_T + f_{IF}$, where the PLL can acquire lock. The PLL will establish lock with the expected lock frequency after a pull-in time.

In the embodiment of FIG. 4, it is assumed that the response of VCO 7 is not very fast. When using a VCO with high speed response, it will be necessary to connect a resistor having somewhat smaller valve than resistor $R_7$ in series with diode $D_1$. The illustrated frequency synthesizer of FIG. 4 is designed to lock VCO 7 with frequency $f_T - f_{IF}$. It, however, will be understood for one skilled in the art that a frequency synthesizer which locks VCO 7 with frequency $f_T + f_{IF}$ can be designed according to the above teaching.

Figure 7:
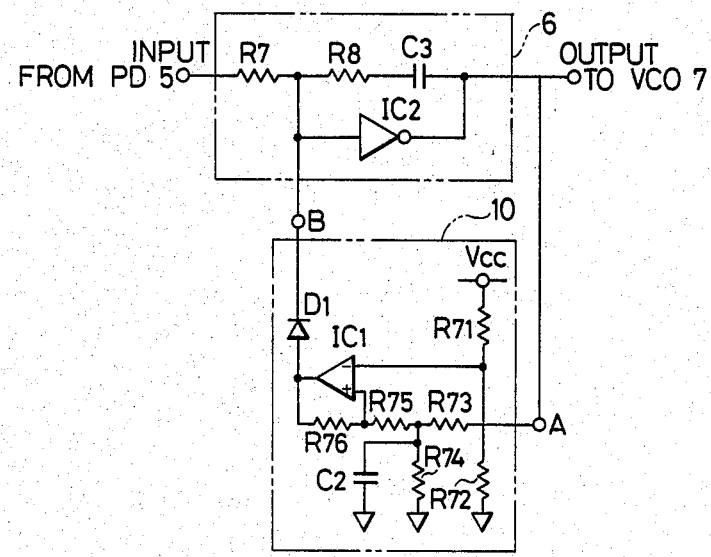
FIG. 7 is a circuit diagram showing a second specific embodiment of the detection-control circuit and the lowpass filter in the PLL frequency synthesizer of FIG. 3.

Another embodiment according to the invention is illustrated in FIG. 7. Detection-control circuit 10 detects the PLL operation status by the DC level at the output of lowpass filter 6 and feedback the detected results to lowpass filter 6 internally. Since the detecting input terminal A is placed behind the controlling output terminal B, comparator $IC_1$ is provided with an appropriate hysteresis property due to the positive feedback through resistors $R_{75}$ and $R_{76}$, and the detecting input signal is provided with an appropriate delay time through resistors $R_{73}$, $R_{74}$ and capacitor $C_2$. This delay time is determined from the open loop response time of the PLL during which the control signal starts from control output terminal B and reaches detecting input terminal A through lowpass filter 6, VCO 7, mixer 4 and phase detector 5. Since this delay time is an inherently necessary time for re-establishing lock in the PLL, the delayed detecting signal through resistors $R_{73}$, $R_{75}$ and capacitor $C_2$ does not cause the total response of the PLL system to be delayed. As an advantage of the circuit of FIG. 7, since detection-control circuit 10 detects DC voltage levels, it does not require the smoothing circuit ($R_2$, $C_1$ in FIG. 4) for smoothing the pulse signal from phase detector 5, as required in the circuit of FIG. 4. Accordingly, this circuit configuration is advantageous in involving no delay time due to the smoothing. And also circuit 10 of FIG. 7 has a further advantage. There is no signal leakage from the input to the output of the detection-control circuit 10, which tends to occur in handling AC signals (with degradation of the characteristics of the PLL during acquiring lock and keeping lock), because circuit 10 handles DC signals only.

Figure 8:
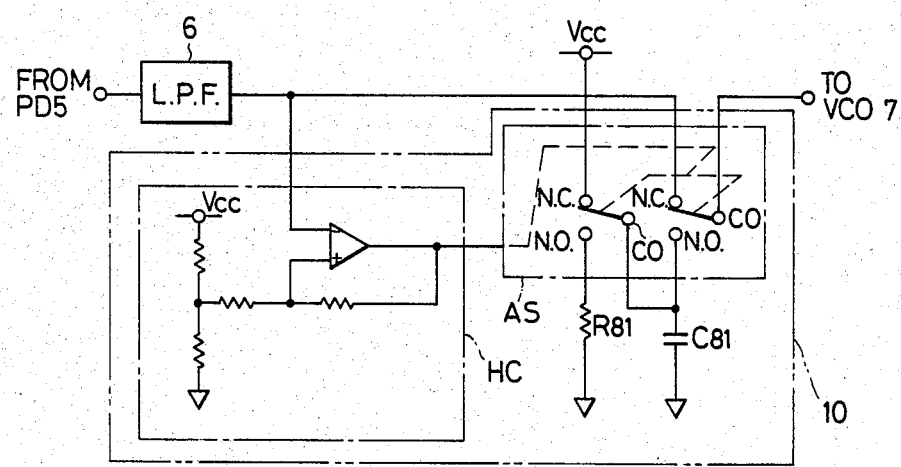
FIG. 8 is a circuit diagram showing a third specific embodiment of the detection-control circuit of FIG. 3.

Another specific example of detection-control circuit 10 is shown in FIG. 8. When the output of hysteresis comparator HC becomes high level, common terminal CO of analog switch AS with ganged moveable switch elements is connected to contact NC. When the output level of comparator HC becomes low, common terminal CO is connected to contact NO. Hysteresis comparator HC in circuit 10 detects from the output voltage of lowpass filter 6 the status in which the PLL is out of the capture range and upon the detection switches common terminal CO of analog switch AS from contact NC side to contact NO side. At this time, the charge in capacitor $C_{81}$ which has been charged up to power supply voltage $V_{cc}$ starts to be discharged through resistor $R_{81}$. While common terminal CO of analog switch AS is connected to contact NO, the input voltage to VCO 7 continuously descends from voltage $V_{cc}$ at a rate determined by the time constant of $C_{81}$ and $R_{81}$. As the control voltage for VCO 7 descends, output frequency $f_R$ of VCO 7 also goes lower. When $f_R < f_T + f_{IF}$, the output voltage of phase detector 5 descends from $V_{cc}$ to 0 volt and output frequency $f_R$ of VCO 7 falls into the capture range. At this state, since hysteresis comparator HC is inverted and then common terminal CO of analog switch AS is connected to contact NC, the PLL starts its operation and is locked with frequency $f_R = f_T - f_{IF}$. With detection-control circuit 10 as illustrated in FIG. 8, since abrupt voltage changes do not take place at the input of the voltage controlled oscillator while the PLL is acquiring lock after it has been thrown out of lock, and also since locking is established with the smallest voltage change, other associated high frequency equipments will not be substantially affected and the pull-in time for acquiring lock is short.

In a VCO which is designed to be locked with frequency $f_T - f_{IF}$, the VCO frequency will reach the maximum frequency of the lock range when the PLL has been thrown out of the capture range. Where the VCO is designed to be locked with frequency $f_T + f_{IF}$, the VCO frequency will reach the minimum frequency of the lock range when the PLL has been thrown out of the capture range.

In the illustrated embodiments, the frequency synthesizers according to the invention are used as a local oscillator in receivers. The invention can also find use in transmitters. That is, either one of a signal of frequency $f_R$ produced through the frequency synthesizer according to the invention and a signal of frequency $f_T$ produced through a conventional signal generator can be adapted for use in a receiver or transmitter. And also, the frequency synthesizer according to the invention can be used with any signal generator, not just a generator for producing a transmitting or receiving signal.

I claim:

1. A phase locked loop (PLL) frequency tracking circuit for receiving a variable frequency ($f_T$) signal at a first input port (IN1) and a predetermined frequency ($f_{IF}$) signal at a second input port (IN2) and producing at an output port (OUT) an output signal having a frequency equal to the absolute value of the sum or difference of the two frequencies ($f_T$, $f_{IF}$) of the signals received at the first and second input ports, said circuit having a predetermined lock range, and including:

- a mixer provided with a pair of input terminals and an output terminal, one input terminal of said pair being connected to said first input port and the other input terminal of said pair being connected to said output port,
- a phase detector provided with a pair of input terminals and an output terminal, one input terminal of said pair being connected to the mixer output terminal and the other input terminal of said pair being connected to the second input port,
- a voltage controlled oscillator (VCO) provided with an input terminal and an output terminal, the input terminal being connected to the phase detector output terminal and the output terminal being connected to the said other mixer input terminal, characterized in that the PLL frequency tracking circuit further comprises a detection-control circuit connected between said phase detector output terminal and said VCO input terminal for detecting that the PLL is out of its lock range and upon the detection temporarily applying to the VCO a predetermined voltage which adjusts the oscillating frequency of the VCO to a frequency at which the PLL is in its lock range and is able to perform phase locked loop locking for said variable frequency ($f_T$) signal.

2. A phase locked loop (PLL) frequency tracking circuit according to claim 1, further comprising an active lowpass filter connected between said phase detector and said VCO, wherein said filter includes an active element, a feedback resistor connected between an output and an input of said active element, and an input resistor connected to said input of said active element at a junction with said feedback resistor and wherein said detection-control circuit applies said predetermined voltage to said VCO at said junction of said input resistor and said feedback resistor.

* * * * *